US012683085B2

(12) United States Patent
Randall et al.

(10) Patent No.: US 12,683,085 B2
(45) Date of Patent: Jul. 14, 2026

(54) ELECTROLYTIC CAPACITOR FOR A SEMICONDUCTOR DEVICE HAVING IMPROVED CONDUCTIVE POLYMER LAYER

(71) Applicant: Saras Micro Devices, Inc., Chandler, AZ (US)

(72) Inventors: Michael Randall, Simpsonville, SC (US); Richard Sheridan, Gilbert, AZ (US)

(73) Assignee: Saras Micro Devices, Inc., Chandler, AZ (US)

( * ) Notice: Subject to any disclaimer, the term of this patent is extended or adjusted under 35 U.S.C. 154(b) by 174 days.

(21) Appl. No.: 18/666,659

(22) Filed: May 16, 2024

(65) Prior Publication Data

US 2025/0357052 A1    Nov. 20, 2025

(51) Int. Cl.
| | |
|---|---|
| *H01G 9/025* | (2006.01) |
| *H01G 9/07* | (2006.01) |
| *H01G 9/15* | (2006.01) |
| *H10W 44/00* | (2026.01) |

(52) U.S. Cl.
CPC ............... *H01G 9/025* (2013.01); *H01G 9/15* (2013.01); *H01G 9/07* (2013.01); *H10W 44/601* (2026.01)

(58) Field of Classification Search
CPC . H01G 9/025; H01G 9/15; H01G 9/07; H01L 23/642; H10W 44/601
USPC ................................................. 361/523, 525
See application file for complete search history.

(56) References Cited

U.S. PATENT DOCUMENTS

| | | | |
|---|---|---|---|
| 2003/0147202 A1* | 8/2003 | Kudoh ................... | H01G 11/48 361/523 |
| 2005/0162815 A1* | 7/2005 | Tseng ..................... | H01G 9/025 361/523 |
| 2009/0147446 A1* | 6/2009 | Sugawara .............. | H01G 9/028 205/199 |
| 2012/0044615 A1* | 2/2012 | Takahashi ............ | H01G 9/0036 29/25.03 |
| 2014/0211372 A1* | 7/2014 | Sugawara ................ | H01B 1/20 29/25.03 |
| 2023/0006788 A1 | 1/2023 | Dai et al. | |
| 2023/0026186 A1* | 1/2023 | Sugawara .............. | H01G 9/025 |

OTHER PUBLICATIONS

Micromachines. "Focused Electron Beam-Based 3D Nanoprinting forScanning Probe Microscopy: A Review;" Harold Plank et al.; http://www.mdpi.com/journal/micromachines.

* cited by examiner

*Primary Examiner* — Arun Ramaswamy
(74) *Attorney, Agent, or Firm* — Stetina Garred Brucker & Newboles

(57) ABSTRACT

An electrolytic capacitor for a semiconductor device includes a conductive substrate, a dielectric layer on the conductive substrate, and a conductive polymer layer on the dielectric layer. The conductive polymer layer may include at least one additive. The at least one additive may include an anodizing agent to promote oxide growth of the dielectric layer. The at least one additive may instead or additionally include an organic solvent, an additive to promote hydration resistance of the dielectric layer, and/or an additive to increase conductivity of the conductive polymer layer.

20 Claims, 3 Drawing Sheets

400

500

600

700

ELECTROLYTIC CAPACITOR FOR A SEMICONDUCTOR DEVICE HAVING IMPROVED CONDUCTIVE POLYMER LAYER

CROSS-REFERENCE TO RELATED APPLICATIONS

Not Applicable

STATEMENT RE: FEDERALLY SPONSORED RESEARCH/DEVELOPMENT

Not Applicable

BACKGROUND

The present disclosure relates to electrolytic capacitors and, more specifically, to solid electrolyte aluminum electrolytic capacitors having one or more additives to improve the effectiveness and/or robustness of the conductive polymer layer.

Current solid electrolyte aluminum electrolytic capacitors exhibit numerous advantages over electrolytic capacitors using traditional non-solid electrolytes, such as improved equivalent series resistance (ESR) and thus superior ripple current performance, superior capacitance vs. frequency performance, etc. The conductive polymers typically used for the solid electrolyte are also advantageous in that they exhibit a self-healing mechanism that counteracts point defects in the aluminum oxide dielectric. In particular, the aluminum oxide dielectric can, during storage and/or operation of the capacitor, become weakened, causing defects to form where leakage current may occur. In response to the leakage current caused by a point defect in the dielectric, the conductive polymer may cease to conduct electricity in a local area corresponding to the point defect. For example, leakage current from the point defect may cause the conductive polymer to rise past its decomposition temperature such that the local area of the conductive polymer corresponding to that point defect decomposes and thus no longer conducts electricity. This self-healing mechanism effectively can remove the point defect from the capacitor by locally passivating the conductive polymer electrolyte around it.

While the self-healing mechanism that occurs in the conductive polymer is beneficial to prevent short circuiting of the capacitor, it has downsides. The overall capacitance is reduced by virtue of one or more areas of the conductive polymer ceasing to conduct electricity. As a result, if the concentration of point defects in an electrolytic capacitor is high, the capacitance may become unacceptable, rendering the capacitor ineffective for its intended purpose. Additionally, the self-healing mechanism may be incapable of removing more subtle defects. For example, if the conductive polymer is hygroscopic in nature, water absorption from the atmosphere may cause the conductive polymer to become hydrated over time and may expose the aluminum oxide dielectric layer to that hydration. Hydrated forms of aluminum oxide ($Al_2O_3$), such as bochmite or pseudobochmite ($AlO(OH)$), etc., may exhibit inferior dielectric properties, such as reduced dielectric constant, increased dielectric loss, reduced dielectric withstanding voltage, reduced insulation resistance, increased leakage current, and the like. In frequent instances, degradation of the aluminum oxide dielectric from these hydration reactions or other sources may result in leakage current forming at areas of the aluminum oxide layer which are more subtle than the aforementioned point defects. As such, the self-healing mechanism of the conductive polymer may not sufficiently heal the associated areas of the dielectric, as sufficient local energy is not available to ablate, sublimate, or otherwise passivate or remove the conductive polymer electrolyte in the area of the compromised dielectric. This is a problem in the industry, and to address it, some manufacturers recommend storing these capacitors in humidity-controlled atmospheres and/or in sealed, non-permeable packages containing active desiccant, although these practices can only go so far in delaying the issue.

BRIEF SUMMARY

The present disclosure contemplates improved electrolytic capacitors for overcoming the above drawbacks accompanying the related art. One aspect of the embodiments of the present disclosure is an electrolytic capacitor for a semiconductor device, the electrolytic capacitor comprising a conductive substrate, a dielectric layer on the conductive substrate, and a first conductive polymer layer on the dielectric layer. The first conductive polymer layer may include at least one additive. The at least one additive may include an anodizing agent to promote oxide growth of the dielectric layer.

The electrolytic capacitor may comprise a second conductive polymer layer without the at least one additive on the first conductive polymer layer. The electrolytic capacitor may comprise a layer of the at least one additive on the first conductive polymer layer. The electrolytic capacitor may comprise a conductive carbonaceous layer on the first conductive polymer layer (or on the second conductive polymer layer or additive layer) and a metallization layer on the conductive carbonaceous layer.

Another aspect of the embodiments of the present disclosure is an electrolytic capacitor for a semiconductor device, the electrolytic capacitor comprising a conductive substrate, a dielectric layer on the conductive substrate, a first conductive polymer layer on the dielectric layer, and a second conductive polymer layer on the first conductive polymer layer. The second conductive polymer layer may include at least one additive. The at least one additive may include an anodizing agent to promote oxide growth of the dielectric layer. The first conductive polymer layer may include conductive polymer but without the at least one additive. The electrolytic capacitor may comprise a conductive carbonaceous layer on the second conductive polymer layer and a metallization layer on the conductive carbonaceous layer.

Another aspect of the embodiments of the present disclosure is an electrolytic capacitor for a semiconductor device, the electrolytic capacitor comprising a conductive substrate, a dielectric layer on the conductive substrate, and an additive layer on the dielectric layer. The additive layer may include at least one additive. The at least one additive may include an anodizing agent to promote oxide growth of the dielectric layer. The electrolytic capacitor may further comprise a conductive polymer layer on the additive layer. The conductive polymer layer may or may not include the at least one additive. The electrolytic capacitor may comprise a conductive carbonaceous layer on the conductive polymer layer and a metallization layer on the conductive carbonaceous layer.

In any of the above aspects of the embodiments of the present disclosure, the anodizing agent may be selected from the group consisting of boric acid, borax, ammonium boric acid, amine phosphates, adipic acid, ammonium adipic acid, dimethyl ethoxy ethanolamine, dimethylethanolamine, tartaric acid, citric acid, ammonium citrate, tri-ammonium citrate, phosphoric acid, and associated salts thereof. The anodizing agent may be 0.01-50 wt. % of a conductive polymer layer or 0.01-100 wt. % of an additive layer having the at least one additive without the conductive polymer.

The at least one additive may include an organic solvent instead of or in addition to the anodizing agent. The organic solvent may be selected from the group consisting of ethyl acetate, acetonitrile, dimethyl sulfoxide, γ-butyrolactone, methylpyrrolidone, dimethylformamide, propylene carbonate, tetrahydrofuran, sulfolane, ethylene glycol, polyethylene glycol, and a chain alcohol containing three or more carbon atoms per molecule. The organic solvent may be 0.01-50 wt. % of a conductive polymer layer or 0.01-100 wt. % of an additive layer having the at least one additive without conductive polymer.

The at least one additive may include an additive to promote hydration resistance of the dielectric layer instead of or in addition to the anodizing agent and/or the organic solvent. The additive to promote hydration resistance of the dielectric layer may be selected from the group consisting of polyols, glycerin acetates, tertiary amines and associated alcohols, silanes, and alkyl silanes. The additive to promote hydration resistance of the dielectric layer may be 0.01-50 wt. % of a conductive polymer layer or 0.01-100 wt. % of an additive layer having the at least one additive without conductive polymer.

The at least one additive may include an additive to increase conductivity of the conductive polymer layer instead of or in addition to the anodizing agent, the organic solvent, and/or the additive to promote hydration resistance of the dielectric layer. The additive to increase conductivity of the conductive polymer may be selected from the group consisting of amines, polar solvents, and alcohols. The additive to increase conductivity of the conductive polymer may be 0.01-50 wt. % of a conductive polymer layer or 0.01-100 wt. % of an additive layer having the at least one additive without conductive polymer.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

The present disclosure encompasses various embodiments of electrolytic capacitors and methods of manufacturing the same. The detailed description set forth below in connection with the appended drawings is intended as a description of several currently contemplated embodiments and is not intended to represent the only form in which the disclosed subject matter may be developed or utilized. The description sets forth the functions and features in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

Figure 1:
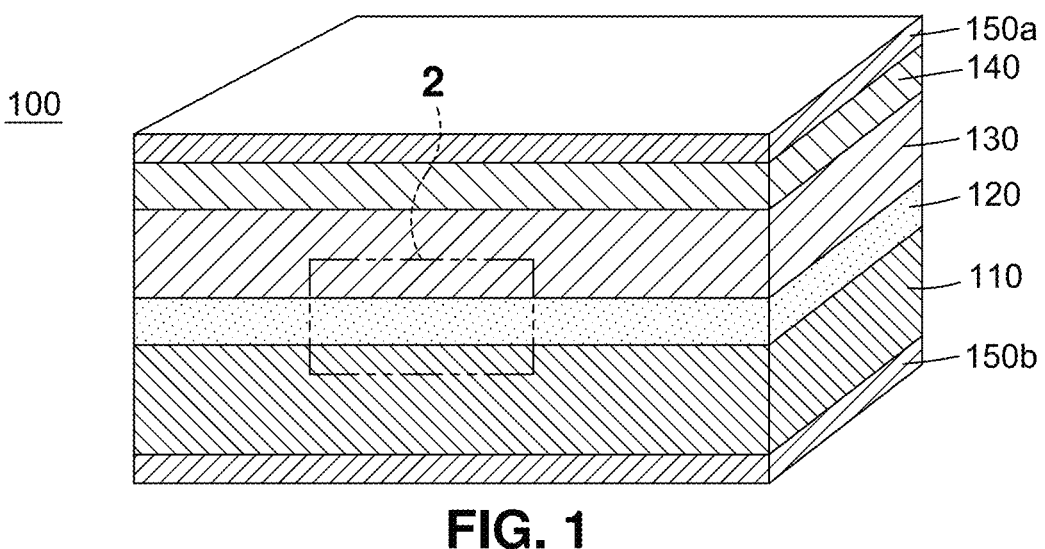
FIG. 1 is a cross-sectional view of an electrolytic capacitor according to an embodiment of the present disclosure.

FIG. 1 is a cross-sectional view of an electrolytic capacitor 100 according to an embodiment of the present disclosure. The electrolytic capacitor 100 may be surface mountable or may be embedded (e.g., in a package substrate or interposer of a semiconductor device). The electrolytic capacitor 100 may comprise a conductive substrate 110 serving as a first electrode (e.g., anode), which may be made of aluminum, an aluminum alloy, or another material (e.g., tantalum or other valve metal) that may be etched or otherwise modified to have a high surface area, such as an etched aluminum foil as described in Applicant's own U.S. Patent Application Pub. No. 2023/0067888 ("the '888 publication"), entitled "Planar High-Density Aluminum Capacitors for Stacking and Embedding," the entire contents of which is incorporated by reference herein. The capacitor 100 may further comprise a dielectric layer 120 on the conductive substrate 110 and a conductive polymer layer 130 on the dielectric layer 120. The conductive polymer layer 130 may serve as the electrolyte or second electrode (e.g., counter electrode or cathode) of the electrolytic capacitor 100. Advantageously, the conductive polymer layer 130 may include, in addition to the conductive polymer, one or more additives that help to increase the robustness and/or effectiveness of the electrolytic capacitor 100 by repairing defects in the dielectric layer 120, maintaining capacitance, increasing hydration resistance, and/or enhancing other properties of the electrolytic capacitor 100. The one or more additives may include, individually or in any combination, an anodizing agent to promote planar, barrier type anodization oxide growth of the dielectric layer 120 when the electrolytic capacitor is forward biased, an organic solvent to improve the effect of the anodizing agent, an additive to promote hydration resistance of the dielectric layer 120, and an additive to increase conductivity of the conductive polymer and/or to enhance other properties of the electrolytic capacitor 100.

More specifically, the conductive substrate 110 of the capacitor 100 may comprise a solid metal portion and a high surface area (HSA) portion on an outer surface thereof, which may include the dielectric layer 120 conformal therewith. The dielectric layer 120 may be a naturally occurring oxide layer (e.g., an aluminum oxide layer) or one that has been grown by an anodization process (e.g., by placing the conductive substrate 110 including the HSA portion in an electrolytic solution and passing a current through the solution), grown by thermal oxidation in a humidity chamber, or coated on the HSA portion of the conductive substrate 110 (e.g., by atomic layer deposition). As may be appreciated, the dielectric layer 120 may, in general, exhibit the same high surface area as the underlying HSA portion of the conductive substrate 110 as it fills in and takes the shape of the various tunnels and recesses that may result from the etching or other modification to the material of the conductive substrate 110.

The conductive polymer layer 130 may likewise be provided conformal with the HSA portion of the conductive substrate 110, so as to be electrically isolated from the conductive substrate 110 by the dielectric layer 120. In particular, the conductive polymer layer 130 may exhibit the same high surface area as the underlying conductive substrate 110 as it fills in and takes the shape of the various tunnels and recesses that may result from the etching or other modification to the material of the conductive substrate 110, with the dielectric layer 120 sandwiched therebetween. The conductive polymer layer 130 may serve as the electrolyte or second electrode (e.g., cathode) of the electrolytic capacitor 100, with the conductive substrate 110 serving as the first electrode (e.g., anode). A variety of conductive polymers may be suitable for use in the conductive polymer layer 130. The conductive polymer layer 130 may, for example, comprise one or more of a polypyrrole, a polythiophene, a polyaniline, a polyacetylene, a polyphenylene, a poly(p-phenylene-vinylene), PEDOT:PSS (poly(3,4-ethylenedioxythiophene) polystyrene sulfonate), or P3HT (poly (3-hexylthiophene-2,5-diyl)) or the like.

Figure 2:
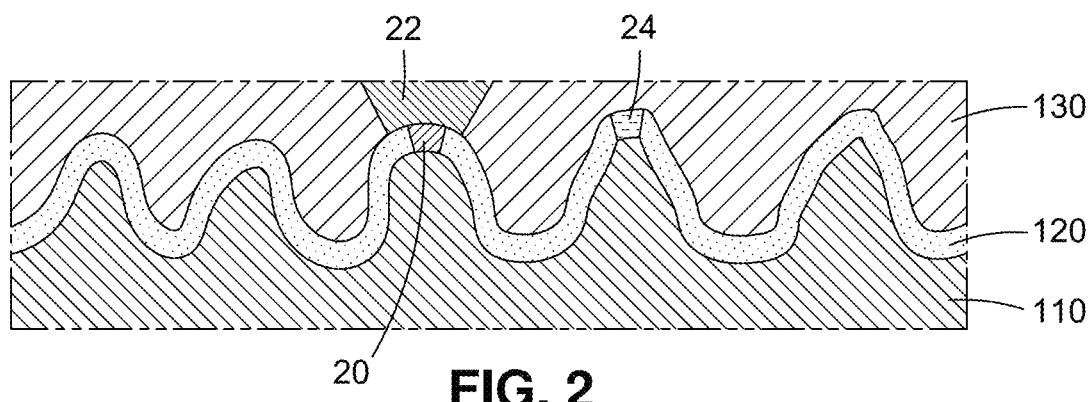
FIG. 2 is an enlarged view of a portion of FIG. 1.

FIG. 2, which is an enlarged view of a portion of FIG. 1, illustrates a comparison between the conventional self-healing mechanism that occurs in the conductive polymer and the disclosed mechanism of repairing point defects in the dielectric layer 120 that is described herein. As may be appreciated, both mechanisms may occur together in the same electrolytic capacitor 100, resulting in highly effective elimination of point defects in the dielectric layer 120. In the illustrated example, the conventional self-healing mechanism has occurred in relation to a point defect 20 in the dielectric layer 120. Where the dielectric layer 120 has a point defect 20, the conductive polymer may react by passivating a local area 22 of the conductive polymer layer 130 corresponding to the point defect 20. This mechanism, referred to as the self-healing mechanism of the conductive polymer, may be effective at preventing the point defect 20 from short circuiting the electrolytic capacitor 100. However, the passivated local area 22 of the conductive polymer layer 130 may, by virtue of no longer being conductive, decrease the overall capacitance of the electrolytic capacitor 100. Additionally, this self-healing mechanism may not be capable of recognizing or eliminating more subtle defects in the dielectric layer 120.

As noted above, the one or more additives included in the conductive polymer layer 130 may include an anodizing agent to promote oxide growth of the dielectric layer 120. When the anodizing agent is present and the electrolytic capacitor 100 is operated (e.g., forward biased), the anodizing agent can re-anodize and essentially reform the dielectric layer 120. The resulting oxide growth may be planar and may reform the dielectric layer 120 as a barrier without holes. This re-anodization has surprisingly been found to directly target degraded areas of aluminum, with areas in the dielectric that exhibit relatively increased leakage current being anodized more than robust areas. As represented in FIG. 2, a second point defect in the dielectric layer 120 may thus be eliminated by the addition of a re-anodized region 24, which replaces the portion of the original dielectric layer 120 having the point defect without passivating a corresponding portion of the conductive polymer layer 130. Additionally, this anodic oxidation has been found to eliminate more subtle defects in the dielectric layer 120 that the self-healing mechanism of the conductive polymer may not target. Since the conductive polymer need not become passivated with this mechanism, the capacitance of the electrolytic capacitor 100 may be preserved. Preferably, the electrolytic capacitor 100 may be electrically forward biased at or near rated voltage while exhibiting this anodic oxidation mechanism of the anodizing agent. The effect may occur alongside the self-healing mechanism of the conductive polymer, with the two mechanisms together being highly effective in preserving the capacitance and other desirable properties of the electrolytic capacitor 100 while also stabilizing the insulation resistance of the dielectric layer 120, ensuring low leakage current when the electrolytic capacitor 100 is exposed to humid/moist environments over time.

The anodizing agent may comprise certain weak acids or their associated salts such as those disclosed herein. For example, the anodizing agent may comprise boric acid, borax, ammonium boric acid, amine phosphates (e.g., ammonium phosphate, di-ammonium phosphate), adipic acid, ammonium adipate, ammonium adipic acid, dimethyl ethoxy ethanolamine, dimethylethanolamine, tartaric acid, citric acid, ammonium citrate, tri-ammonium citrate, phosphoric acid, any associated salts of the aforesaid compounds, or combinations thereof. Of these anodizing agents, amine phosphates, ammonium adipic acid, dimethyl ethoxy ethanolamine, dimethylethanolamine, and other phosphate salts are particularly preferred for electrolytic capacitors containing aluminum oxide dielectric, as these anodizing agents may produce hydration-resistant alumina dielectric during anodization. The anodizing agent may include weak acids as opposed to chlorides or strong acids such as sulfuric, nitric, or hydrochloric that might have a tendency to form holes in the oxide. The anodizing agent present in the conductive polymer layer 130 may range from 0.01%-50%, preferably 0.01%-25%, more preferably 0.1%-20%, and most preferably 0.1%-15% by total weight of the conductive polymer layer 130.

The one or more additives included in the conductive polymer layer 130 may further include an additive to enable the anodizing agent to operate more effectively in anodizing or reforming the dielectric layer 120. In particular, an organic solvent may be included in the conductive polymer layer 130, preferably a polar organic solvent with suitably high polarity and suitably high boiling point. The organic solvent may, for example, provide mobility to the anodizing agent so as to enhance anodization/reformation of the dielectric layer 120 during operation of the electrolytic capacitor 100. The organic solvent may comprise ethyl acetate, acetonitrile, dimethyl sulfoxide, γ-butyrolactone, methylpyrrolidone, dimethylformamide, propylene carbonate, tetrahydrofuran, sulfolane, ethylene glycol, polyethylene glycol, sorbitol, ionic organic compounds, surfactants, a chain alcohol containing three or more carbon atoms per molecule, or combinations thereof. The organic solvent present in the conductive polymer layer 130 may range from 0.01%-50%, preferably 0.01%-25%, more preferably 0.1%-20%, and most preferably 0.1%-15% by total weight of the conductive polymer layer 130.

The one or more additives included in the conductive polymer layer 130 may further include an additive to promote hydration resistance of the dielectric layer 120. This type of additive may inhibit hydration/dissolution of the dielectric layer 120 via one or more mechanisms, such as passivation of aluminum oxide with regard to hydration. This additive may provide this hydration robustness to the dielectric layer 120 even when the electrolytic capacitor 100 is not forward biased. The additive to promote hydration resistance of the dielectric layer 120 may comprise polyols (e.g., triols such as glycerin, glycerol, and the like), glycerin acetates (e.g., monoacetylglycerols, diacetylglycerols, triacetalglycerol, and the like), tertiary amines and associated alcohols (e.g., choline, diphenhydramine, doxylamine, ethanolamine, dimethyl ethanolamine, diethyl ethanolamine dimethyl ethoxy ethanolamine, meclofenoxate, centrophenoxine, orphenadrine, and the like), silanes (e.g., triethoxysilane and the like), alkyl silanes (e.g., methyltrimethoxysilane, propyltrimethoxysilane, dodecyltrimethoxysilane, and the like), or combinations thereof. The additive to promote hydration resistance in the dielectric layer 120 may be present in the conductive polymer layer 130 in a range from 0.01%-50%, preferably 0.01%-25%, more preferably 0.1%-20%, and most preferably 0.1%-15% by total weight of the conductive polymer layer 130.

The one or more additives included in the conductive polymer layer 130 may further include an additive to increase the conductivity of the conductive polymer layer 130. The additive may, for example, increase the electrical conductivity or reduce the bulk resistance of the conductive polymer by 25% or even 50% or more. The additive (or an additional additive) may further be selected to increase the work function (e.g., to maximize insulation resistance) between the conductive polymer layer 130 and the dielectric layer 120 and/or to reduce the work function (e.g., to minimize insulation resistance) between the conductive polymer layer 130 and a conductive carbonaceous layer 140, metallization layer 150, or other layer(s) with which the conductive polymer layer 130 interfaces to function as a cathode. These effects, including increased bulk electrical conductivity/resistance and improved interfacial electrical properties, can result in reduced leakage current and/or reduced ESR exhibited by the electrolytic capacitor 100. This conductivity increasing additive may comprise amines (e.g., aniline, methylamine, octylamine, diethylamine, pentylamine), polar solvents (e.g., dimethyl sulfoxide (DMSO), DMSO-hydrobromic acid, methylpyrrolidone), alcohols (e.g., sorbitol, glycol, ethylene glycol, diethylene glycol, propylene glycol, propylene glycol, polyethylene glycol), and components thereof, or combinations thereof. The additive to increase the conductivity of the electrolytic capacitor 100 may be present in the conductive polymer layer 130 in a range from 0.01%-50%, preferably 0.01%-25%, more preferably 0.1%-20%, and most preferably 0.1%-15% by total weight of the conductive polymer layer 130.

It should be noted that some of the additives described herein may serve the function of more than one type of additive. For example, methylpyrrolidone present in a conductive polymer layer 130 may act as an organic solvent to enable the anodizing agent to operate more effectively in anodizing or reforming the dielectric layer 120, while also acting as an additive to increase the conductivity of the conductive polymer.

In addition to the dielectric layer 120 and the conductive polymer layer 130 serving as the electrolyte or second electrode (e.g., cathode), the electrolytic capacitor 100 may include additional layers on the conductive polymer layer 130 in order to improve the electrical connection between the conductive polymer layer 130 and an external circuit. In this regard, one or more conductive layers may be provided. For example, a transitional conductive layer such as a conductive carbonaceous layer 140 (e.g., a carbon ink) may be provided on the conductive polymer layer 130, and a metallization layer 150*a* (e.g., Ag or Ti/Cu) may be applied on the conductive carbonaceous layer 140 or other transitional conductive layer (or directly on the conductive polymer layer 130 in some cases). Preferably, the application of the metallization layer 150*a* may comprise depositing a diffusion barrier on the carbonaceous layer 140*a* and depositing metal adjacent the diffusion barrier.

The carbonaceous layer 140, if included, may advantageously serve as a transitional conductive layer by reducing a contact resistance between the conductive polymer layer 130 and other components, such as a diffusion barrier layer of the metallization layer 150*a*. The carbonaceous layer 140 may include, for example, carbon black, graphite, a carbon-based ink, or a polymeric, and may be applied using a variety of techniques, such as screen printing, inkjet printing, sputter deposition, vacuum deposition, spin coating, doctor blading, or the like. The metallization layer 150*a* may be used to provide high-quality electrical conductivity between the conductive polymer layer 130 (acting as the second electrode of the electrolytic capacitor 100) and metal terminal(s) for connecting the cathode of the electrolytic capacitor 100 to an external circuit, for example. The metallization layer 150*a* may include a metal such as Ag, Au, Cu, Pt, Pd, and/or composites or alloys of the aforementioned metals, or in some cases polymers or polymer/conductor composites such as epoxies, silicones, or fluoroelastomers which are electrically conductive. Including a diffusion barrier layer in the metallization layer 150*a* may limit infiltration of components from the metallization layer 150*a* into the carbonaceous layer 140 or conductive polymer layer 130. Example materials for a diffusion barrier layer include, but are not limited to, Ti, W, Cr, Ti—W, TaN, and/or Co—W. The metallization layer 150*a*, as well as any diffusion barrier layer thereof, may be applied using any suitable techniques, such as vacuum deposition (e.g., sputter deposition) or physical vapor deposition (e.g., PVD). A second metallization layer 150*b* may be provided on the opposite side of the conductive substrate 110 for connecting the anode of the electrolytic capacitor 100 to an external circuit, for example.

In the example of FIG. 1, only a single conductive polymer layer 130 is illustrated containing one or more of the additives described herein (e.g., as a homogeneous mixture with the conductive polymer). However, multilayer structures are contemplated as well, which may include any number of conductive polymer layers 130 containing one or more additives, conductive polymer layers 130′ without additives, and/or additive layers 130″ containing only one or more additives without the conductive polymer. By the same token, any layers containing one or more of the additives described herein may contain fewer than the full number of additives included in the device, with some layers containing some of the additives and other layers containing the other additives. Using a layered approach to separate different additives from each other and/or from the conductive polymer in this way may allow for flexibility in the manufacturing process. FIGS. 3-7 illustrate a few examples of such layered structures in the form of electrolytic capacitors 300, 400, 500, 600, 700, which may be the same as electrolytic capacitor 100 except as described herein.

Figure 3:
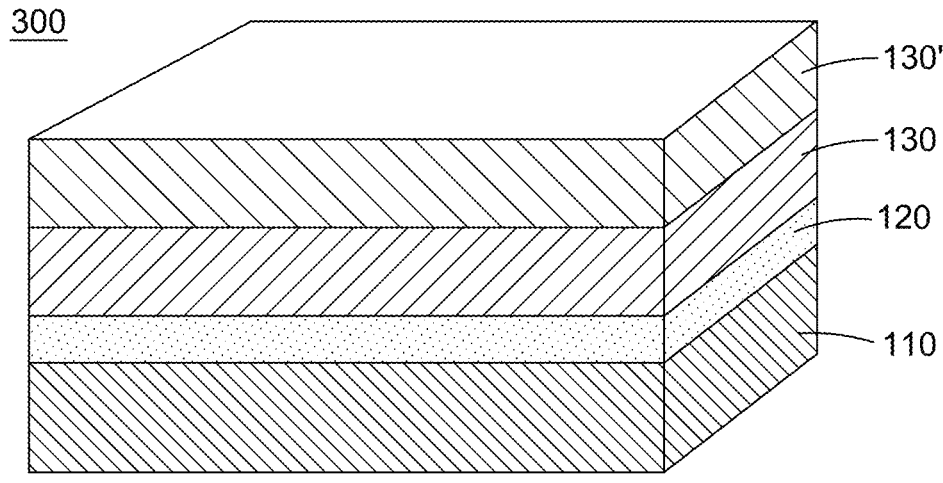
FIG. 3 is a cross-sectional view of another electrolytic capacitor according to an embodiment of the present disclosure.

FIG. 3 shows an electrolytic capacitor 300 that is the same as the electrolytic capacitor 100 except that it further comprises a second conductive polymer layer 130′ on the first conductive polymer layer 130. The second conductive polymer layer 130′ may include the conductive polymer without the one or more additives of the first conductive polymer layer 130. In this regard, the conductive polymer layer 130′ may be pure conductive polymer (i.e., without any of the described additives) or it may be conductive polymer without the same additive(s) as the first conductive polymer layer 130 (such as with a different subset of the additives described herein).

Figure 4:
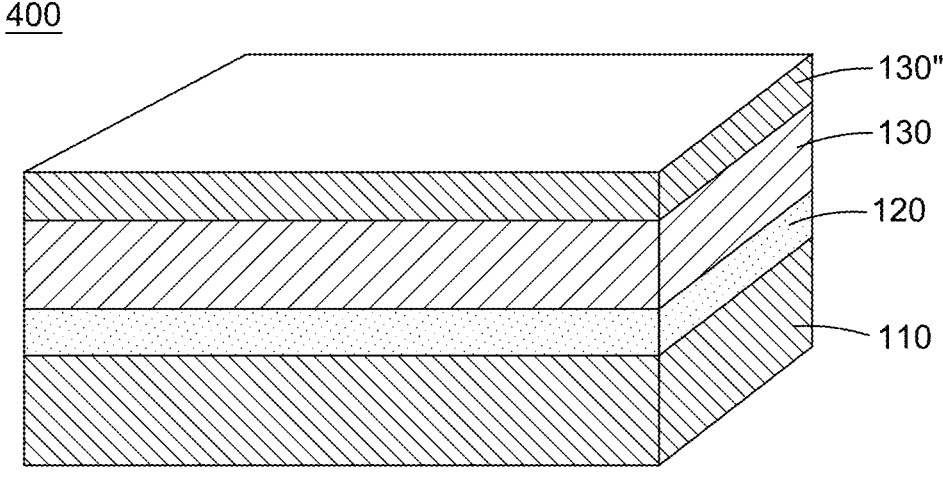
FIG. 4 is a cross-sectional view of another electrolytic capacitor according to an embodiment of the present disclosure.

FIG. 4 shows an electrolytic capacitor 400 that is the same as the electrolytic capacitor 100 except that it further comprises an additive layer 130" on the first conductive polymer layer 130. The additive layer 130" may include the one or more additives of the first conductive polymer layer 130 but without the conductive polymer. Alternatively, the additive layer 130" may include a different subset of the additives described herein that is not the same as the subset of additives included in the conductive polymer layer 130. It is contemplated that a particular type of additive (anodizing agent, organic solvent, additive to promote hydration resistance of the dielectric layer 120, additive to increase conductivity of the conductive polymer, etc.) may be the dominant additive present. Any particular type of additive may be present in an additive layer 130" in a range from 0.01%-100%, preferably from 0.1%-99%, more preferably 1%-95%, and most preferably 5%-95% by total weight of that additive layer 130".

Figure 5:
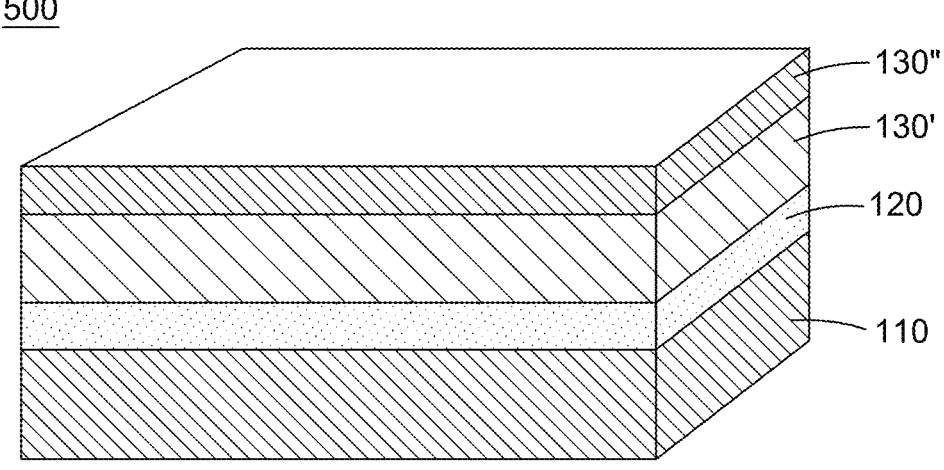
FIG. 5 is a cross-sectional view of another electrolytic capacitor according to an embodiment of the present disclosure.

FIG. 5 shows an electrolytic capacitor 500 that is the same as the electrolytic capacitor 400 except that the conductive polymer layer 130' may contain only the conductive polymer without any of the additives. In this case, the additives to be included in the electrolytic capacitor 400 may be separated from the conductive polymer into one or more additive layers 130" rather than being mixed into the same layer(s) as the conductive polymer.

Figure 6:
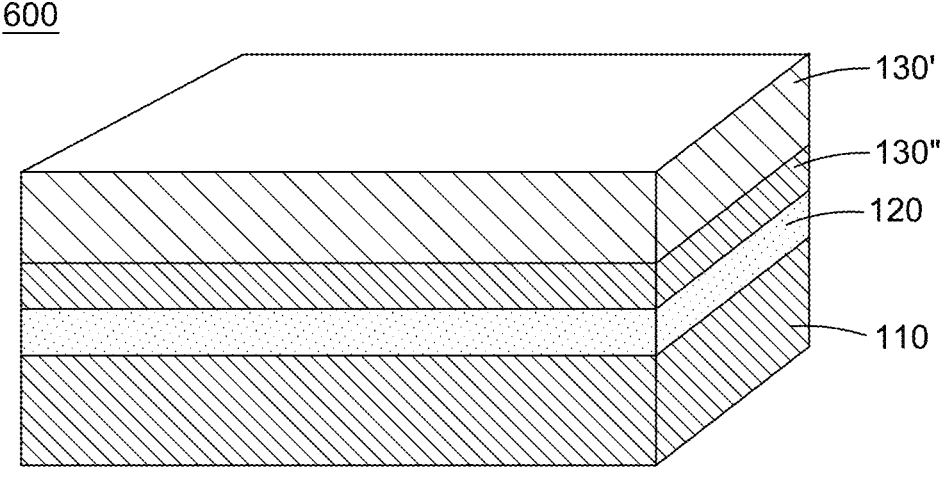
FIG. 6 is a cross-sectional view of another electrolytic capacitor according to an embodiment of the present disclosure.
Figure 7:
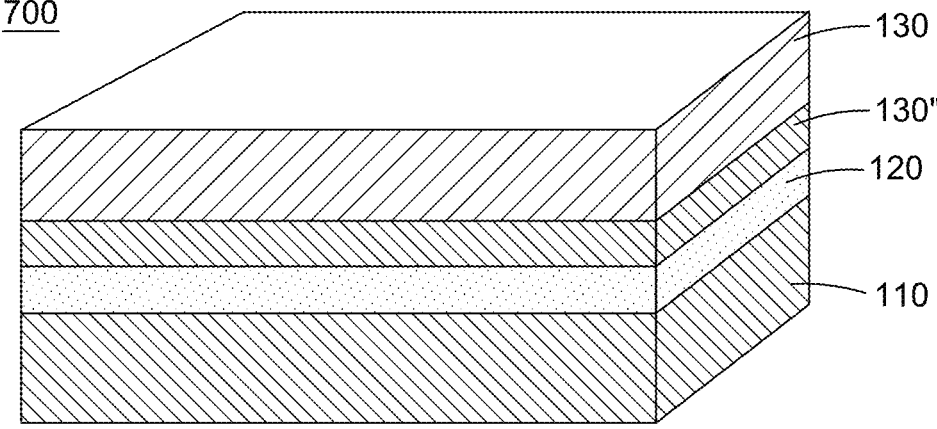
FIG. 7 is a cross-sectional view of another electrolytic capacitor according to an embodiment of the present disclosure.

FIGS. 6 and 7 show an electrolytic capacitor 600 and an electrolytic capacitor 700, respectively, illustrating examples in which an additive layer 130" having one or more additives but without conductive polymer may be formed on the dielectric layer 120 as the first layer of a stack of layers. In the case of the electrolytic capacitor 600, a conductive polymer layer 130' without the one or more additives is provided on the additive layer 130" such that the additive(s) and the conductive polymer are in separate layers similar to the electrolytic capacitor 500. In the case of the electrolytic capacitor 700, a conductive polymer layer 130 with additive(s) included therein is provided on the additive layer 130".

The examples shown in FIGS. 3-7 are only some of the many possible layered structures that are contemplated by the present disclosure. For example, in any of the illustrated electrolytic capacitors 300, 400, 500, 600, 700, additional layers 130, 130', 130" may be provided and/or the specific additive(s) included in one layer may differ from the additive(s) included in another. On top of any such contemplated layered structure, a carbonaceous layer 140 and/or a metallization layer 150a may be formed as described above (and a second metallization layer 150b may be formed on the opposite side of the conductive substrate 110).

A specific example of additives that may be included in an additive layer 130" separate from the conductive polymer is one or more of ammonium adipate or a derivative, and/or ammonium phosphate or a derivative as an anodization agent(s) at a level of 0-100 wt. %, preferably 0.01 to 50 wt. %, more preferably 0.05 to 20 w % and most preferably from 0.1 to 10 wt. % so as to promote dielectric reformation under bias, combined with one or more of DMSO (dimethyl sulfoxide) or NMP (1-methyl-2-pyrrolidone) as a solvent(s) at the level of 0 to 100 wt. %, preferably 0.01 to 50 wt. %, more preferably 0.05 to 25 wt. % and most preferably 0.1 to 10 wt. % to promote mobility of the reformation chemistry (e.g., positive ions that enable anodization through losing electrons) as well as to increase the conductive polymer conductivity, combined with one or more of a polyol such as glycerin, and/or a silane such as methyltrimethoxysilane, at the level of 0 to 100 wt. %, preferably 0.1 to 50 w %, more preferably 0.5 to 25 wt. % and most preferably from 1 to 10 wt. % to promote hydration resistance and/or to promote interfacial resistance at the interface between the dielectric layer 120 and the conductive polymer layer 130, combined with one or more of a glycol, such as diethylene glycol and/or an aniline, such as diethylamine at the level of 0 to 100 wt. %, preferably 0.01 to 50 wt. %, more preferably 0.05 to 25 wt. % and most preferably from 0.1 to 10 wt. % to further promote conductivity of the conductive polymer layer 130, and/or to promote interfacial resistance between the dielectric layer 120 and the conductive polymer layer 130 (which may be via an additive layer 130" in some cases).

A specific example of additives that may be included in the conductive polymer layer 130 is one or more of ammonium adipate or a derivative, and/or ammonium phosphate or a derivative as an anodization agent(s) at a level of 0-50 wt. %, preferably 0.01 to 25 wt. %, more preferably 0.025 to 15 wt. % and most preferably from 0.05 to 10 wt. %, so as to promote dielectric reformation under bias, combined with one or more of DMSO (dimethyl sulfoxide) or NMP (1-methyl-2-pyrrolidone) as a solvent(s) at the level of 0 to 50 wt. %, preferably 0.005 to 25 wt. %, more preferably 0.025 to 15 wt. % and most preferably 0.05 to 10 wt. % to promote mobility of the reformation chemistry (e.g., positive ions that enable anodization through losing electrons) as well as to increase conductivity of the conductive polymer layer 130, combined with one or more of a polyol such as glycerin, and/or a silane such as methyltrimethoxysilane, at the level of 0 to 50 wt. %, preferably 0.05 to 25 wt. %, more preferably 0.25 to 15 wt. % and most preferably from 0.5 to 10 wt. % to promote hydration resistance and/or to promote interfacial resistance at the interface between the dielectric layer 120 and the conductive polymer layer 130, combined with one or more of a glycol, such as diethylene glycol and/or an aniline, such as diethylamine at the level of 0 to 50 wt. %, preferably 0.01 to 50 wt. %, more preferably 0.05 to 25 wt. % and most preferably from 0.1 to 10 wt. % to further promote conductivity of the conductive polymer layer 130, and/or to promote interfacial resistance between the dielectric layer 120 and the conductive polymer layer 130 (which may be via an additive layer 130" in some cases).

To manufacture a conductive polymer aluminum electrolytic capacitor such as the electrolytic capacitors 100, 300, 400, 500, 600, 700 described herein, a relatively low viscosity conductive polymer liquid may be infiltrated into the porous structure of the conductive substrate 110 (typically aluminum foil) that has been previously etched and anodized as described above to establish the conductive polymer layer 130 serving as the counter electrode or cathode of the device. Establishment of the conductive polymer layer 130 may vary, and may involve multiple steps (e.g., infiltration, development, drying, etc.), as well as multiple repetitions of these steps. In particular, in order to establish the specially formulated conductive polymer electrolyte (also referred to as a modified electrolyte) that includes one or more of the types of additives disclosed herein (either in the same layer(s) or separate layer(s) from the conductive polymer), one or more repetitions of the above steps may be undertaken involving at least one intrusion step, followed by at least one drying step. For example, only one type of solution could be intruded into the dielectric substrate structure, in which case a homogeneous mixture of conductive polymer and one or more additives may be manufactured, or multiple solutions can be intruded into the dielectric substrate structure. In this latter case, multiple conductive polymer layers 130, 130' and/or additive layers 130" may be formed by intruding a first solution of a first composition, allowing the first solution to dry, intruding a second solution of a second composition, allowing the second solution to dry, and repeating until the desired number of layers has been manufactured. The established conductive polymer layer 130 and or other layers 130', 130" is then typically covered with conductive carbon (typically graphite, typically by thick film methods) to produce the carbonaceous layer 140, followed typically by conductive metal (typically silver, typically by thick film methods) to produce the metallization 150a layer. This structure may be connected to an I/O (input/output) lead that is typically a conductive metal, which serves to provide electrical connection of the device cathode to the outside world, thereby completing the cathode structure of the capacitor device. The anode portion of the device may typically be connected to the outside world as well via a metallic lead structure that is connected to the anode portion of the device.

By modifying the conductive polymer electrolyte portion of the counter electrode (e.g., cathode) of the described electrolytic capacitors as described herein, it is anticipated that the resulting capacitors will exhibit superior humidity/moisture robustness, as well as improved ESR (and related performance characteristics), thus providing a solution to the unmet need of improved humidity/moisture robustness of conductive polymer aluminum electrolytic chip or embedded capacitor devices. Additionally, it is likely that the resulting devices will be less costly to produce as less conductive polymer and/or fewer manufacturing steps may be required. For example, by increasing the conductivity of the conductive polymer, fewer iterations of conductive polymer impregnation may be required (as well as fewer iterations of conductive polymer development) to achieve a desired capacitance and ESR.

As described herein, the conductive substrate 110 serving as a first electrode (e.g., anode), may be made of a material that is etched (e.g., plasma etched) or otherwise modified to have a high surface area, such as an etched aluminum foil as described in the '888 publication, Alternative or additional modifications to increase the surface area of the conductive substrate 110 may include deposition of a sintered aluminum powder or other aluminum, aluminum oxide, titanium, or titanium oxide powder thereon. The conductive substrate 110 may be a metal foil as described in Applicant's own U.S. Patent Application Pub. No. 2023/0073898 ("the '898 publication"), entitled "Modified Metal Foil Capacitors and Methods for Making Same," the entire contents of which is incorporated by reference herein.

Additional examples of electrolytic capacitors incorporating the disclosed subject matter may include an electrolytic capacitor that is formed from an aluminum containing valve metal object that has been anodized to form a dielectric aluminum oxide coating thereon to form the anode portion and the dielectric portion of said capacitor, combined with a cathode counter electrode that is at least partially comprised of a conductive polymer electrolyte, said electrolyte containing one or more additives of the type(s) described herein and within the concentration ranges disclosed herein. The conductive polymer electrolyte portion of the cathode counter electrode may be comprised of a layered structure having at least one layer of pure conductive polymer, layered with at least one layer comprising one or more additives of the type(s) described herein and within the concentration ranges disclosed herein. At least one of the one or more pure conductive polymer layers may be substituted with modified conductive polymer containing one or more additives of the type(s) described herein within the disclosed concentration ranges. One or more of the additive layer(s) may be substituted with modified conductive polymer comprising one or more additives of the type(s) described herein and within the concentration ranges disclosed herein. The conductive polymer electrolyte portion of the cathode counter electrode may be comprised of a layered structure having at least one layer of pure conductive polymer, layered with at least one layer comprising one or more additives of the type(s) described herein and at least one layer of modified conductive polymer comprising one or more additives of the type(s) described herein and within the concentration ranges disclosed herein.

The examples of electrolytic capacitors incorporating the disclosed subject matter may further include a conductive polymer aluminum electrolytic capacitor constructed with a cathode structure containing one or more of carbon or similar transitional layer material, and/or silver or similar metallic conductive layer, and utilizing one or more conductive polymers as at least a portion of its cathode counter electrode and exhibiting a leakage current (L), where $L \leq 0.05$ CV when measured using common measurement techniques, where leakage current (L) is in microAmps ($\mu$A), C is capacitance in microFarads ($\mu$F), and V is rated voltage in volts (V).

The examples of electrolytic capacitors incorporating the disclosed subject matter may further include a conductive polymer aluminum electrolytic capacitor having specified capacitance value of 650 $\mu$F (microFarads), constructed with a cathode structure containing one or more of carbon and/or silver, and utilizing one or more conductive polymers as at least a portion of its cathode counter electrode and exhibiting an ESR (equivalent series resistance) value of $\leq 3$ m$\Omega$ (milliohms) when measured at 100 KHz (Kilohertz) and at 25° C.+/−5° C.

The examples of electrolytic capacitors incorporating the disclosed subject matter may further include a conductive polymer aluminum electrolytic capacitor constructed with a cathode structure containing one or more of carbon or similar transitional layer material, and/or silver or similar metallic conductive layer, and utilizing one or more conductive polymers as at least a portion of its cathode counter electrode and exhibiting a leakage current (L), where $L \leq 0.1$ CV when measured using common measurement techniques, where leakage current (L) is in microAmps ($\mu$A), C is capacitance in microFarads ($\mu$F), and V is rated voltage in volts (V), when subjected to humid environment of at least 65° C. (degrees Celsius), and at least 65% RH (percent relative humidity), for a duration of at least 100 h (hours).

The examples of electrolytic capacitors incorporating the disclosed subject matter may further include a conductive polymer aluminum electrolytic capacitor constructed with a cathode structure containing one or more of carbon or similar transitional layer material, and/or silver or similar metallic conductive layer, and utilizing one or more conductive polymers as at least a portion of its cathode counter electrode and exhibiting a leakage current (L), where $L \leq 0.1$ CV when measured using common measurement techniques, where leakage current (L) is in microAmps ($\mu$A), C is capacitance in microFarads ($\mu$F), and V is rated voltage in volts (V), when subjected to humid environment of at least 65° C. (degrees Celsius), and at least 65% RH (percent relative humidity), for a duration of at least 100 h (hours) under DC (direct current) bias of at least 10% of RV (rated voltage).

The examples of electrolytic capacitors incorporating the disclosed subject matter may further include a conductive polymer aluminum electrolytic capacitor constructed with a cathode structure containing one or more of carbon or similar transitional layer material, and/or silver or similar metallic conductive layer, and utilizing one or more conductive polymers as at least a portion of its cathode counter electrode and exhibiting a leakage current (L), where L≤0.1 CV when measured using common measurement techniques, where leakage current (L) is in microAmps (μA), C is capacitance in microFarads (μF), and V is rated voltage in volts (V), when subjected to humid environment of at least 65° C. (degrees Celsius), and at least 65% RH (percent relative humidity), for a duration of at least 100 h (hours) under DC (direct current) bias of at least 10% of RV (rated voltage), combined with an AC (alternating current) ripple voltage of at least 10 mVrms (milliVolts, root mean square basis) at one or more frequencies≤1 MHz (megahertz).

The above description is given by way of example, and not limitation. Given the above disclosure, one skilled in the art could devise variations that are within the scope and spirit of the invention disclosed herein. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. An electrolytic capacitor for a semiconductor device, the electrolytic capacitor comprising:
   a conductive substrate;
   a dielectric layer on the conductive substrate; and
   a first conductive polymer layer on the dielectric layer, the first conductive polymer layer including at least one additive, the at least one additive including an anodizing agent to promote oxide growth of the dielectric layer;
   wherein the electrolytic capacitor further comprises a layer of the at least one additive on the first conductive polymer layer.

2. The electrolytic capacitor of claim 1, wherein the anodizing agent is selected from the group consisting of boric acid, borax, ammonium boric acid, amine phosphates, adipic acid, ammonium adipic acid, dimethyl ethoxy ethanolamine, dimethylethanolamine, tartaric acid, citric acid, ammonium citrate, tri-ammonium citrate, phosphoric acid, and associated salts thereof.

3. The electrolytic capacitor of claim 1, wherein the anodizing agent is 0.01-50 wt. % of the conductive polymer layer.

4. The electrolytic capacitor of claim 1, wherein the at least one additive in the first conductive polymer layer further includes an organic solvent.

5. The electrolytic capacitor of claim 4, wherein the organic solvent is selected from the group consisting of ethyl acetate, acetonitrile, dimethyl sulfoxide, γ-butyrolactone, methylpyrrolidone, dimethylformamide, propylene carbonate, tetrahydrofuran, sulfolane, ethylene glycol, polyethylene glycol, and a chain alcohol containing three or more carbon atoms per molecule.

6. The electrolytic capacitor of claim 4, wherein the organic solvent is 0.01-50 wt. % of the conductive polymer layer.

7. The electrolytic capacitor of claim 1, wherein the at least one additive in the first conductive polymer layer further includes an additive to promote hydration resistance of the dielectric layer.

8. The electrolytic capacitor of claim 7, wherein the additive to promote hydration resistance of the dielectric layer is selected from the group consisting of polyols, glycerin acetates, tertiary amines and associated alcohols, silanes, and alkyl silanes.

9. The electrolytic capacitor of claim 7, wherein the additive to promote hydration resistance of the dielectric layer is 0.01-50 wt. % of the conductive polymer layer.

10. The electrolytic capacitor of claim 1, wherein the at least one additive in the first conductive polymer layer further includes an additive to increase conductivity of the conductive polymer layer.

11. The electrolytic capacitor of claim 10, wherein the additive to increase conductivity of the conductive polymer layer is selected from the group consisting of amines, polar solvents, and alcohols.

12. The electrolytic capacitor of claim 10, wherein the additive to increase conductivity of the conductive polymer layer is 0.01-50 wt. % of the conductive polymer layer.

13. The electrolytic capacitor of claim 1, further comprising a second conductive polymer layer without the at least one additive on the layer of the at least one additive.

14. The electrolytic capacitor of claim 1, further comprising:
   a conductive carbonaceous layer on the layer of the at least one additive; and
   a metallization layer on the conductive carbonaceous layer.

15. The electrolytic capacitor of claim 13, further comprising:
   a conductive carbonaceous layer on the second conductive polymer layer; and
   a metallization layer on the conductive carbonaceous layer.

16. An electrolytic capacitor for a semiconductor device, the electrolytic capacitor comprising:
   a conductive substrate;
   a dielectric layer on the conductive substrate;
   a first conductive polymer layer on the dielectric layer; and
   a second conductive polymer layer on the first conductive polymer layer, the second conductive polymer layer including at least one additive, the at least one additive including an anodizing agent to promote oxide growth of the dielectric layer;
   wherein the electrolytic capacitor further comprises a layer of the at least one additive on the second conductive polymer layer.

17. The electrolytic capacitor of claim 16, further comprising:
   a conductive carbonaceous layer on the layer of the at least one additive; and
   a metallization layer on the conductive carbonaceous layer.

18. An electrolytic capacitor for a semiconductor device, the electrolytic capacitor comprising:
   a conductive substrate;
   a dielectric layer on the conductive substrate;
   an additive layer on the dielectric layer, the additive layer including at least one additive, the at least one additive including an anodizing agent to promote oxide growth of the dielectric layer when the electrolytic capacitor is forward biased; and
   a conductive polymer layer on the additive layer.

19. The electrolytic capacitor of claim 18, wherein the conductive polymer layer includes the at least one additive.

20. The electrolytic capacitor of claim 18, further comprising:

a conductive carbonaceous layer on the conductive polymer layer; and a metallization layer on the conductive carbonaceous layer.

* * * * *